United States Patent
Cho et al.

(10) Patent No.: US 9,647,359 B2
(45) Date of Patent: May 9, 2017

(54) ELECTRONIC DEVICE HAVING A TRAY FOR ACCOMMODATING CARDS

(71) Applicant: Samsung Electronics Co., Ltd., Gyeonggi-do (KR)

(72) Inventors: Sung Cho, Gyeonggi-do (KR); Yong Sang Yun, Gyeonggi-do (KR); John Gy Lee, Gyeonggi-do (KR); Beom Ju Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/958,319

(22) Filed: Dec. 3, 2015

(65) Prior Publication Data

US 2016/0164204 A1     Jun. 9, 2016

(30) Foreign Application Priority Data

Dec. 3, 2014 (KR) .................. 10-2014-0172417

(51) Int. Cl.
| | |
|---|---|
| *H01R 12/70* | (2011.01) |
| *H04B 1/3816* | (2015.01) |
| *G06K 19/077* | (2006.01) |
| *H01R 13/633* | (2006.01) |
| *H05K 5/00* | (2006.01) |

(52) U.S. Cl.
CPC ... *H01R 12/7076* (2013.01); *G06K 19/07739* (2013.01); *H01R 13/633* (2013.01); *H04B 1/3816* (2013.01); *H05K 5/0086* (2013.01)

(58) Field of Classification Search
CPC ............ H01R 12/7076; H01R 113/633; H01R 27/00; H05K 5/0086; H05K 5/0282; H04B 1/3816; G06K 19/07739

USPC .............. 439/630, 639, 638, 945, 155, 152; 361/737, 729, 731
See application file for complete search history.

(56) References Cited

U.S. PATENT DOCUMENTS

| | | | | |
|---|---|---|---|---|
| 6,386,920 | B1 * | 5/2002 | Sun ...................... | G06K 7/0021 361/737 |
| 6,669,493 | B2 * | 12/2003 | Kuroda ................ | H01R 13/629 439/157 |
| 6,738,259 | B2 * | 5/2004 | Le .................... | G06K 19/07741 361/737 |
| 6,776,653 | B1 * | 8/2004 | Hsiao .................. | G06K 7/0034 439/541.5 |
| 6,835,100 | B1 * | 12/2004 | Chen .................. | H01R 13/2442 439/630 |
| 6,857,907 | B1 * | 2/2005 | Hung .................. | H01R 12/721 439/630 |

(Continued)

FOREIGN PATENT DOCUMENTS

| | | |
|---|---|---|
| CN | 103715554 | 4/2014 |
| CN | 104158005 | 11/2014 |

OTHER PUBLICATIONS

European Search Report dated Feb. 23, 2016 issued in counterpart application No. 15197599.2-1874, 7 pages.

*Primary Examiner* — Abdullah Riyami
*Assistant Examiner* — Harshad Patel
(74) *Attorney, Agent, or Firm* — The Farrell Law Firm, P.C.

(57) ABSTRACT

An electronic device that accommodates a plurality of cards is provided. The electronic device includes a first contact area connected to a first card among the plurality of cards and a second contact area selectively connected to one of a second card or a third card among the plurality of cards.

17 Claims, 14 Drawing Sheets

(56) References Cited

U.S. PATENT DOCUMENTS

| | | | | |
|---|---|---|---|---|
| 6,932,654 B2* | 8/2005 | Washino | ............... | H01R 27/00 |
| | | | | 439/159 |
| 7,628,653 B2* | 12/2009 | Zhang | ............... | H01R 12/7005 |
| | | | | 439/630 |
| 8,292,667 B1* | 10/2012 | Huang | ............... | H01R 12/714 |
| | | | | 439/541.5 |
| 9,203,458 B2* | 12/2015 | Sutherland | ........... | H04B 1/3816 |
| 9,373,905 B2* | 6/2016 | Liu | ..................... | G06K 7/0052 |
| 2007/0274033 A1* | 11/2007 | Hwang | ................. | G06F 1/186 |
| | | | | 361/679.32 |
| 2012/0276780 A1* | 11/2012 | Hu | ..................... | H01R 12/714 |
| | | | | 439/630 |
| 2013/0267106 A1* | 10/2013 | Jenks | ................... | G11B 17/00 |
| | | | | 439/160 |
| 2014/0104767 A1 | 4/2014 | Sutherland et al. | | |

* cited by examiner

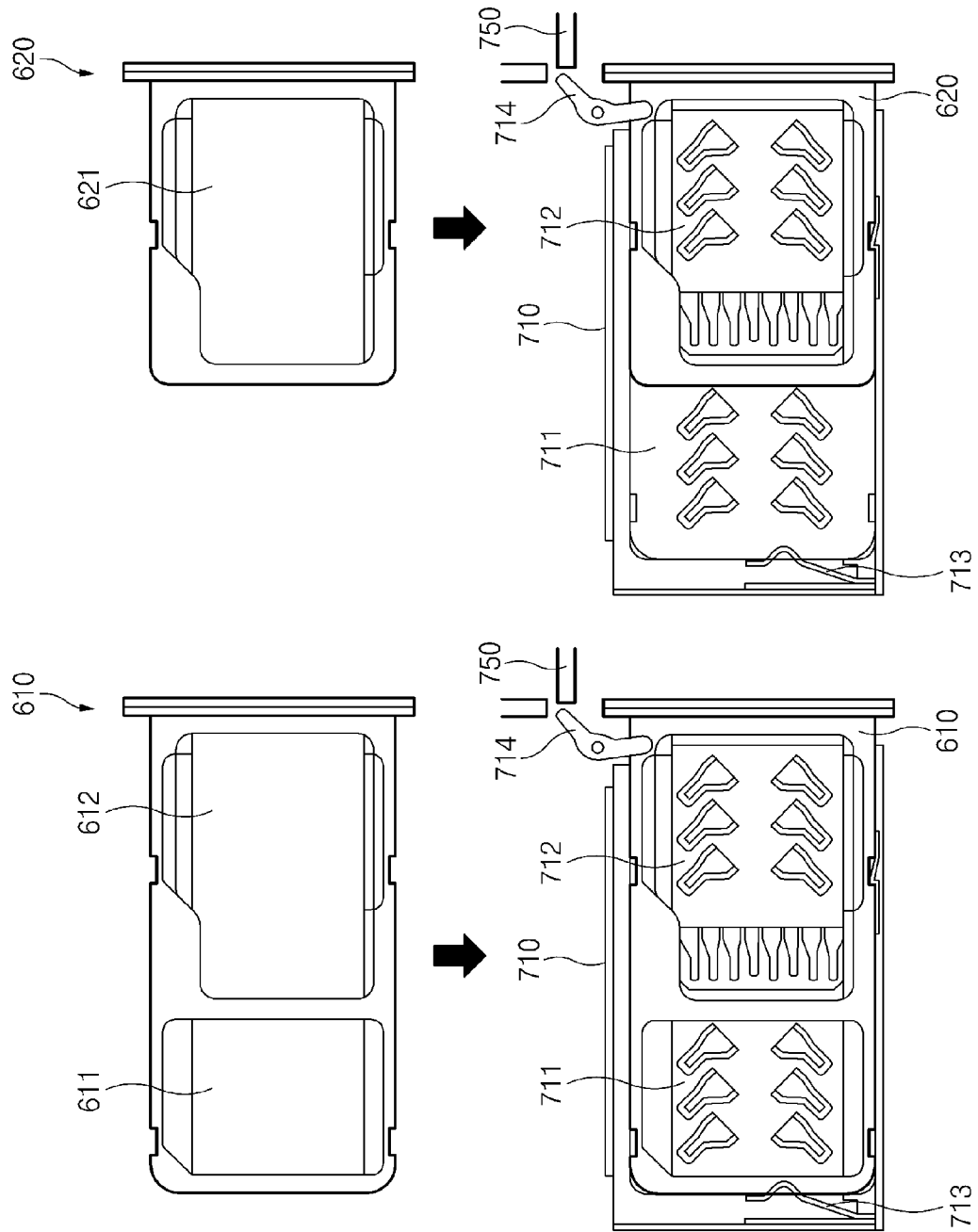

ELECTRONIC DEVICE HAVING A TRAY FOR ACCOMMODATING CARDS

PRIORITY

This application claims priority under 35 U.S.C. §119(a) to Korean Patent Application Serial No. 10-2014-0172417, filed on Dec. 3, 2014 in the Korean Intellectual Property Office, the entire contents of which are incorporated herein by reference.

BACKGROUND

1. Field of the Disclosure

The present disclosure generally relates to an electronic device including a tray for accommodating a plurality of cards.

2. Description of the Related Art

Electronic devices, e.g., smart phones, tablets, etc., perform a variety of communications, e.g., a voice call, a video conference, a data communication, etc., and output image data such as a picture, a video, etc. An electronic device performs the communications in accordance with information stored in a subscriber identification card, e.g., a universal subscriber identity module (USIM), a subscriber identity module (SIM), installed therein and stores data in the subscriber identification card. In addition, the electronic device accommodates a memory card, e.g., a Micro SD card, which differs from the subscriber identification card.

To install the subscriber identification card or the memory card in a conventional electronic device, the electronic device must include a card connector to accommodate each card and a tray to accommodate the card connector. However, the card connector and the tray are typically designed for each specific corresponding type of card, thereby requiring additional space when more than type of one card is utilized.

SUMMARY

The present disclosure has been made to address at least the above-mentioned problems and/or disadvantages and to provide at least the advantages described below. Accordingly, an aspect of the present disclosure provides an electronic device capable of substantially simultaneously installing and utilizing a plurality of cards, which are the same type of card or are different types of cards, using a single card connector.

An aspect of the present disclosure provides an electronic device for accommodating a plurality of cards, with the electronic device including a first contact area connected to a first card among the plurality of cards; and a second contact area selectively connected to one of a second card and a third card among the plurality of cards.

Another aspect of the present disclosure provides an electronic device that includes a tray in which a plurality of cards is installed, and a card connector which accommodates the tray, with the card connector including a first contact area electrically connected to a first card installed in a first card area of the tray, and a second contact area selectively connected to one of a second card and a third card, which is installed in a second card area of the tray.

A further aspect of the present disclosure provides a tray that is insertable into an electronic device, with the tray including a first card area accommodating a first card and a second card area having a shape corresponding to each of the first card and a second card, to accommodate at least one of the first card and the second card.

BRIEF DESCRIPTION OF THE DRAWINGS

The above and other aspects, features, and advantages of the present disclosure will be more apparent from the following description taken in conjunction with the accompanying drawings, in which:

FIG. 7 shows a tray inserted into a card connector according to an embodiment of the present disclosure;

DETAILED DESCRIPTION OF EMBODIMENTS OF THE PRESENT DISCLOSURE

Figure 1:
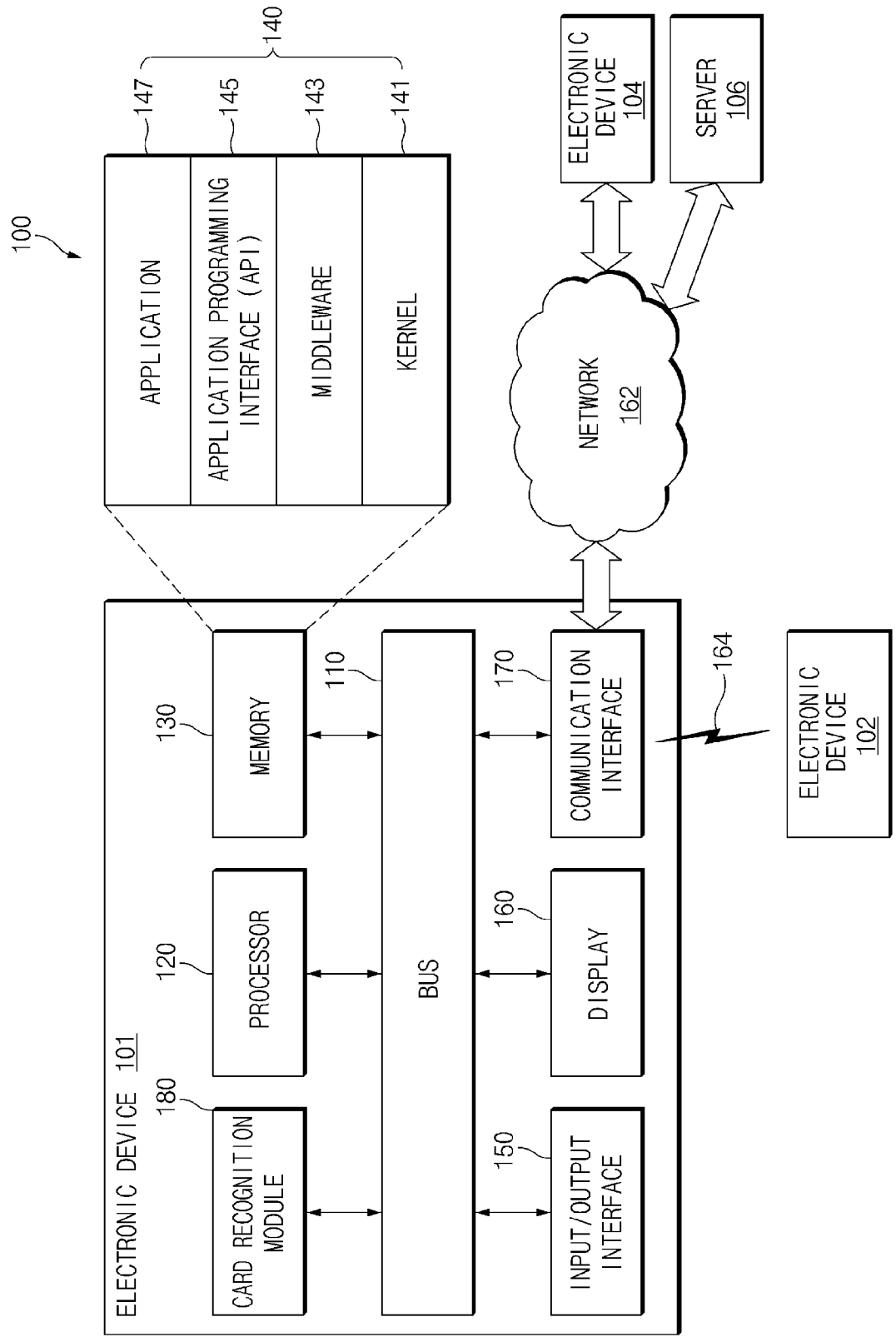
FIG. 1 is a block diagram illustrating an electronic device in a network environment, according to an embodiment of the present disclosure.

Various embodiments of the present disclosure are described with reference to accompanying drawings. Those of ordinary skill in the art will recognize that modifications, changes, and alternatives to the various embodiments described herein can be made without departing from the scope and spirit of the present invention. With regard to description of drawings, similar components may be marked by similar reference numerals.

As used herein, the expressions "have", "may have", "include" and "comprise", or "may include" and "may comprise" indicate existence of corresponding features (e.g., elements such as numeric values, functions, operations, or components), and do not exclude additional features.

As used herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to any or all of the case (1) where at least one A is included, the case (2) where at least one B is included, or the case (3) where both of at least one A and at least one B are included.

The terms "first", "second", and the like used herein may refer to various elements of the present disclosure, but do not limit the configuration of elements. For example, such terms do not limit the order and/or priority of the elements. Furthermore, such terms may be used to distinguish one element from another element. For example, "a first user device" and "a second user device" indicate different user devices. For example, without departing the scope of the present disclosure, a first element may be referred to as a second element, and similarly, a second element may be referred to as a first element.

It will be understood that when an element (e.g., a first element) is referred to as being "operatively or communicatively coupled with/to" or "connected to" another element (e.g., a second element), the element can be directly coupled with/to or connected to the other element, or an intervening element (e.g., a third element) may be present. In contrast, when an element (e.g., a first element) is referred to as being "directly coupled with/to" or "directly connected to" another element (e.g., a second element), it should be understood that no intervening element (e.g., a third element) exists.

According to the situation, the expression "configured to" used herein may be used as, for example, the expression "suitable for", "having the capacity to", "designed to", "adapted to", "made to", or "capable of". The term "configured to" does not mean only "specifically designed to" in hardware. Instead, the expression "a device configured to" indicates what the device is capable of, for example in regards to operating together with another device or other components. For example, a "processor configured to perform A, B, and C" may mean a dedicated processor (e.g., an embedded processor) for performing a corresponding operation or a generic-purpose processor (e.g., a central processing unit (CPU) or an application processor) which may perform corresponding operations by executing one or more software programs which are stored in a memory device.

Terms used to describe specified embodiments are not intended to limit the scope of the present disclosure. The terms of a singular form may include plural forms unless otherwise specified. Unless otherwise defined herein, all the terms used herein, which include technical or scientific terms, may have the same meanings that are generally understood by a person skilled in the art. It will be further understood that terms, which are defined in a dictionary and commonly used, should also be interpreted as is customary in the relevant related art and not in an idealized or overly formal detect unless expressly so defined herein. In some cases, even if terms are defined herein, the terms are not to be interpreted to exclude embodiments of the present disclosure.

An electronic device according to the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, wearable devices (e.g., head-mounted-devices (HMDs), such as electronic glasses), an electronic apparel, electronic bracelets, electronic necklaces, electronic appcessories, electronic tattoos, smart mirrors, smart bands, smart watches, and the like.

According to various embodiments of the present disclosure, the electronic devices may be smart home appliances. The smart home appliances may include at least one of, for example, televisions (TVs), digital versatile disc (DVD) players, audios, refrigerators, air conditioners, cleaners, ovens, microwave ovens, washing machines, air cleaners, set-top boxes, TV boxes (e.g., Samsung HomeSync™, Apple TV™, or Google TV™), game consoles (e.g., Xbox™ and PlayStation™), electronic dictionaries, electronic keys, camcorders, electronic picture frames, and the like.

According to the present disclosure, the electronic devices may include at least one of medical devices (e.g., various portable medical measurement devices (e.g., a blood glucose monitoring device, a heartbeat measuring device, a blood pressure measuring device, a body temperature measuring device, and the like)), a magnetic resonance angiography (MRA), a magnetic resonance imaging (MRI), a computed tomography (CT), scanners, and ultrasonic devices) receiving a user input in an idle mode, navigation devices, global positioning system (GPS) receivers, event data recorders (EDRs), flight data recorders (FDRs), vehicle infotainment devices, electronic equipment for vessels (e.g., navigation systems and gyrocompasses), avionics, security devices, head units for vehicles, industrial or home robots, automatic teller machines (ATMs), points of sales (POS) devices, or Internet of Things (e.g., light bulbs, various sensors, electric or gas meters, sprinkler devices, fire alarms, thermostats, street lamps, toasters, exercise equipment, hot water tanks, heaters, boilers, and the like).

According to an embodiment of the present disclosure, the electronic devices may include at least one of furniture or buildings/structures, electronic boards, electronic signature receiving devices, projectors, or various measuring instruments (e.g., water meters, electricity meters, gas meters, or wave meters, and the like). Electronic devices according to the present disclosure may be one or more combinations of the above-mentioned devices. According to an embodiment of the present disclosure, an electronic device may be a flexible electronic device. Also, electronic devices according to various embodiments of the present disclosure are not limited to the above-mentioned devices, and may include new electronic devices according to the development of new technologies.

Hereinafter, electronic devices according to the present disclosure will be described with reference to the accompanying drawings. The term "user" used herein may refer to a person who uses an electronic device or may refer to a device (e.g., an artificial intelligence electronic device) that uses an electronic device. The same or similar components may be designated by the same or similar reference numerals although they are illustrated in different drawings. Detailed descriptions of constructions or processes known in the art may be omitted to avoid obscuring the subject matter of the present invention.

FIG. 1 is a block diagram illustrating an electronic device in a network environment, according to an embodiment of the present disclosure.

FIG. 1 shows an electronic device 101 in a network environment 100. The electronic device 101 may include a bus 110, a processor 120, a memory 130, an input/output (I/O) interface 150, a display 160, a communication interface 170, and a card recognition module 180. The electronic device 101 may exclude one or more of the above-described components or may include other component(s). According to the present disclosure, the electronic device 101 may be equipped with various cards (e.g., a subscriber identification card, a memory card, and the like) and may recognize the various cards. The electronic device 101 may be equipped with two or more cards, e.g., USIM card 1 and USIM card 2, that are the same type, at one card connector.

The bus 110 may interconnect the above-described components 120 to 180, and may be a circuit for conveying communications (e.g., a control message and/or data) among the above-described components.

The processor 120 may include one or more of a central processing unit (CPU), an application processor (AP), or a communication processor (CP). The processor 120 may perform, for example, data processing or an operation associated with control or communication of at least one other component(s) of the electronic device 101.

The memory 130 may include a volatile and/or nonvolatile memory. The memory 130 may store instructions or data associated with at least one other component(s) of the electronic device 101.

The memory 130 may store software and/or a program 140. The program 140 may include, for example, a kernel 141, middleware 143, an application programming interface (API) 145, and/or an application (or an application program) 147. At least a portion of the kernel 141, the middleware 143, or the API 145 may be referred to as operating system (OS).

The kernel 141 may control or manage system resources (e.g., the bus 110, the processor 120, the memory 130, and the like) that are used to execute operations or functions of other programs (e.g., the middleware 143, the API 145, and the application program 147). Furthermore, the kernel 141 may provide an interface that allows the middleware 143, the API 145, or the application program 147 to access discrete components of the electronic device 101 to control or manage system resources. The middleware 143 may perform a mediation role such that the API 145 or the application program 147 communicates with the kernel 141 to exchange data.

Furthermore, the middleware 143 may prioritize the processing of task requests received from the application program 147. For example, the middleware 143 may assign the priority, which makes it possible to use a system resource (e.g., the bus 110, the processor 120, the memory 130, or the like) of the electronic device 101, to at least one application program 147. For example, the middleware 143 may process the one or more task requests according to the priority assigned to the task, which makes it possible to perform scheduling or load balancing on the one or more task requests.

The API 145 may be an interface through which the application program 147 controls a function provided by the kernel 141 or the middleware 143, and may include, for example, at least one interface or function (e.g., an instruction) for a file control, a window control, image processing, a character control, or the like.

The I/O interface 150 may transmit an instruction or data, input from a user or another external device, to other component(s) of the electronic device 101. Furthermore, the I/O interface 150 may output an instruction or data, received from other component(s) of the electronic device 101, to a user or another external device.

The display 160 may include, for example, a liquid crystal display (LCD), a light-emitting diode (LED) display, an organic LED (OLED) display, or a microelectromechanical systems (MEMS) display, or an electronic paper display. The display 160 may display, for example, various contents (e.g., a text, an image, a video, an icon, a symbol, and the like) to a user. The display 160 may include a touch screen and may receive, for example, a touch, gesture, proximity, or hovering input using an electronic pen, stylus, or a portion of a user's body, such as a finger.

The communication interface 170 may establish communication between the electronic device 101 and an external electronic device 102, 104, or a server 106. For example, the communication interface 170 may be connected to a network 162 through wireless communication or wired communication to communicate with the external electronic device 104 or the server 106.

The wireless communication may include at least one of, for example, long-term evolution (LTE), LTE-advanced (LTE-A), code division multiple access (CDMA), wideband CDMA (WCDMA), universal mobile telephone system (UMTs), wireless broadband (WiBro), global system for mobile communications (GSM), or the like, as cellular communication protocol. The wired communication may include at least one of, for example, a universal serial bus (USB), a high definition multimedia interface (HDMI), a recommended standard-132 (RS-132), or plain old telephone service (POTS). The network 162 may include at least one of telecommunications networks, for example, a computer network (e.g., LAN or WAN), an Internet, or a telephone network.

Each of the first and second external electronic devices 102 and 104 may be a device of which the type is different from or the same as that of the electronic device 101. According to the present disclosure, the server 106 may include a group of one or more servers. According to the present disclosure, all or a part of operations that the electronic device 101 will perform may be executed by another or plural electronic devices (e.g., the electronic devices 102 and 104, and the server 106). If the electronic device 101 executes any function or service automatically or in response to a request, the electronic device 101 may not perform the function or the service internally, but alternatively or additionally, may request at least a portion of a function associated with the electronic device 101 at another device (e.g., the electronic device 102 or 104 or the server 106). The other electronic device 102 or 104 or the server 106 may execute the requested function or additional function and may transmit the execution result to the electronic device 101. The electronic device 101 may provide the requested function or service using the received result or may additionally process the received result to provide the requested function or service. To this end, for example, cloud computing, distributed computing, or client-server computing may be used.

The card recognition module 180 may be equipped with various cards (e.g., a subscriber identification card, a memory card, and the like) which the electronic device 101 is able to use. According to the present disclosure, the card is inserted through a tray that accommodates a plurality of cards. The tray includes an area, i.e., a card area, for accommodating one or more cards, and the card area may have various shapes corresponding to various types of cards.

In FIG. 1, the card recognition module 180 is illustrated as being independent of the processor 120. However, the scope and spirit of the present disclosure is not limited thereto. For example, at least a portion of a function executed on the card recognition module 180 may be performed by the processor 120. Alternatively, the card recognition module 180 may be included as a portion of the processor 120.

The card recognition module 180 includes a card connector corresponding to the tray. The card connector includes a contact area for electrical connection with each card which is accommodated on the tray. Furthermore, the card connector includes a recognition part to sense the tray or a discharge part to discharge the tray. Information about configuration and operation of the tray and the card connector is provided in FIGS. 2 to 12.

Figure 2:
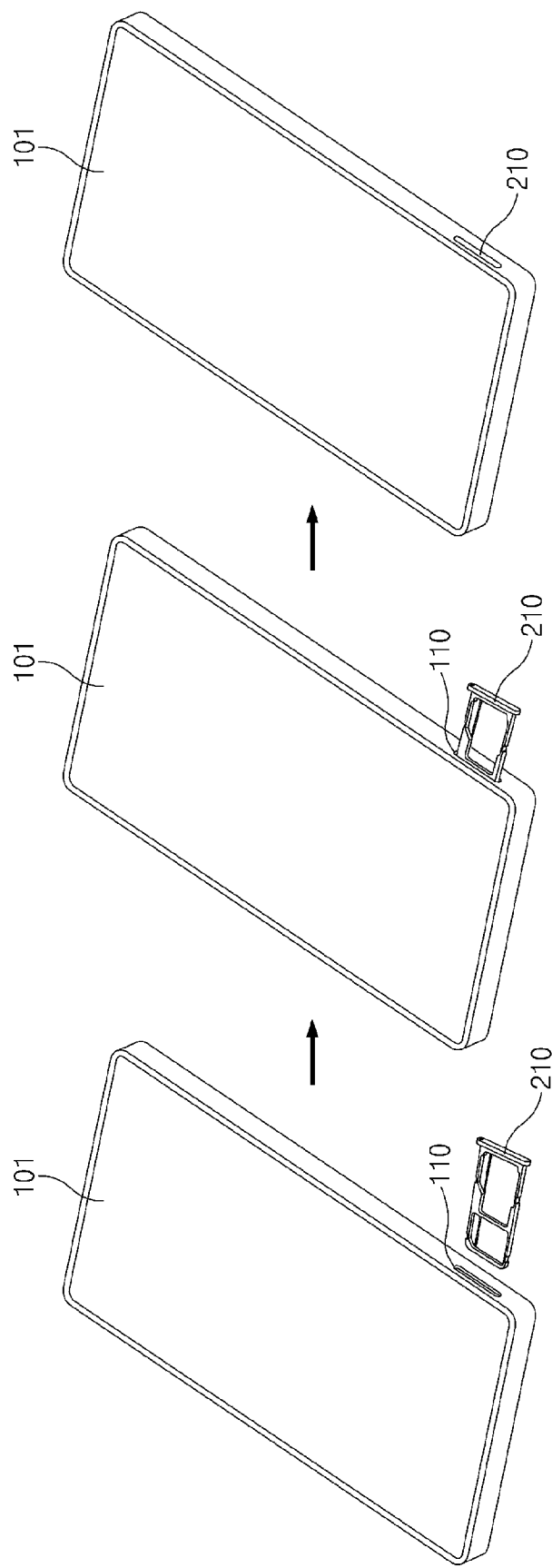
FIG. 2 is a perspective view showing an electronic device according to an embodiment of the present disclosure.

FIG. 2 is a perspective view showing an electronic device according to an embodiment of the present disclosure.

Referring to FIG. 2, an electronic device 101 may accommodate a variety of cards inserted therein. A user may install a subscriber identification card, e.g., a USIM card, an SIM card, etc., or a memory card, e.g., an SD card, a micro SD card, etc., into the electronic device 101. The electronic device 101 includes a contact area defined therein to electrically connect to the card. Hereinafter, the electronic device 101 accommodating the subscriber identification card or the memory card is described, but the present disclosure is not so limited.

The subscriber identification card or the memory card is inserted into the electronic device 101 using a tray 210. The tray 210 has a structure on which the various cards are easily mounted. The tray 210 may be partially or fully inserted into the electronic device 101. When the tray 210 is fully inserted into the electronic device 101, the tray 210 is not visible from outside the electronic device 101 or may be integral with the electronic device 101.

The tray 210 includes a plurality of card areas. The user installs a corresponding card in each of the card areas to insert the card into the electronic device 101. The tray 210 may include at least one hybrid-shaped card area, i.e., a hybrid card area. The hybrid card area may be, but is not limited to, one area realized to correspond to the various cards. For instance, one of the subscriber identification card and the memory card may be installed the hybrid card area. Detailed descriptions of the hybrid card area are provided in FIGS. 3 to 12.

The tray 210 is inserted into the electronic device 101 from outside of the electronic device 101 through an opening portion 110 formed in the electronic device 101. The opening portion 110 is formed through a housing surrounding an outer portion of the electronic device 101. In FIG. 2, the opening portion 110 may be formed through left or right side surfaces of the electronic device 101, but is not so limited. That is, the opening portion 110 may be formed through upper or lower side surfaces of the electronic device 101 or through a rear surface of the electronic device 101. The opening portion 110 may be connected to an entrance of a card connector having a shape corresponding to the shape of the tray 210.

The tray 210 may be realized in a part of the electronic device 101. For instance, the tray 210 may be realized such that the tray 210 is separated from or inserted into the electronic device 101 in a predetermined distance using a connection device, e.g., a string. The user may separate the tray 210 from the electronic device 101 and insert the tray 210 into the electronic device 101 after installing the card on the tray 210. Hereinafter, the tray 210 separately formed from and inserted into the electronic device 101 is mainly described, but the present disclosure is not so limited.

Figure 3:
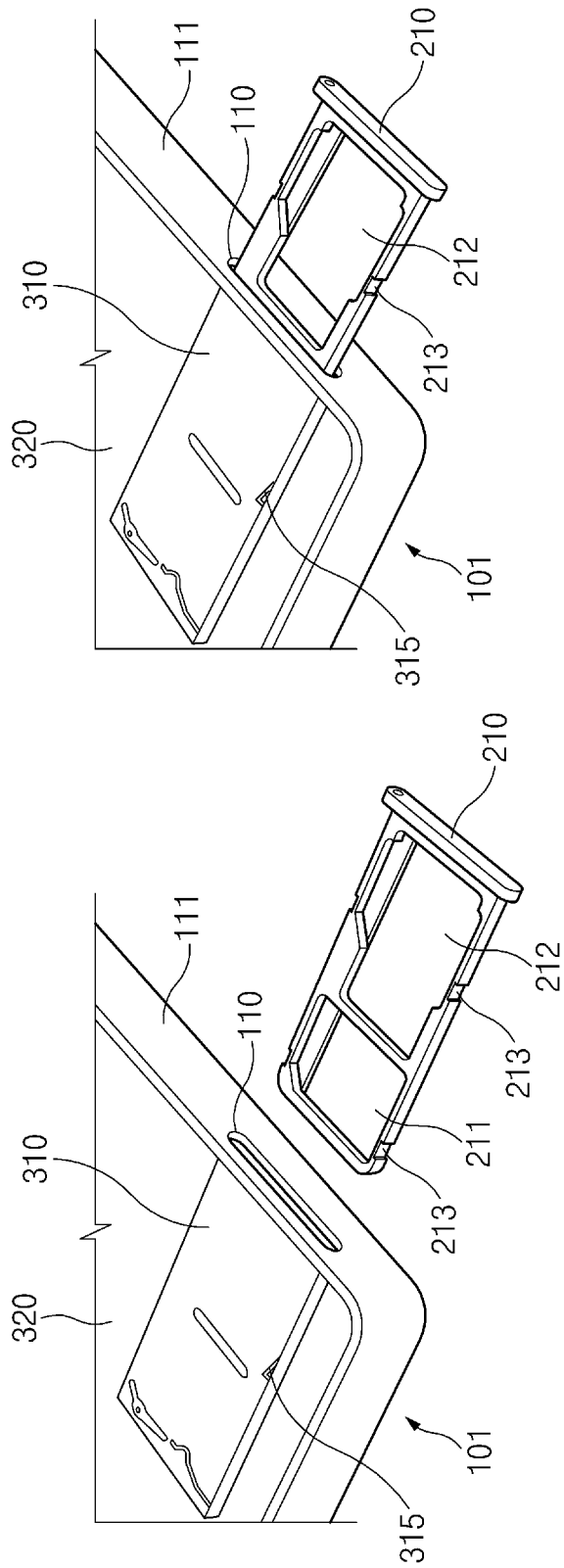
FIG. 3 is a perspective view showing a coupling structure between a card connector and a tray according to an embodiment of the present disclosure.

FIG. 3 is a perspective view showing a coupling structure between a card connector and a tray according to an embodiment of the present disclosure.

Referring to FIG. 3, the electronic device 101 includes a card connector 310 accommodated in the housing. The card connector 310 may be installed on and electrically connected to a circuit board 320 included in the electronic device 101. The tray 210 may be inserted into the electronic device 101 through the entrance of the card connector 310, which is connected to the opening portion 110 in a side 111 of the electronic device 101.

The tray 210 may include a first card area 211 and a second card area 212. The tray 210 may include at least one hybrid card area, e.g., the second card area 212. In FIG. 3, the tray 210 may include the first card area 211 and the second card area 212 and the second card area 212 may be realized as the hybrid card area, but need not be so limited. For instance, the first card area 211 may be realized as the hybrid card area or both the first and second card areas 211 and 212 may be realized as the hybrid card area.

Figure 6A:
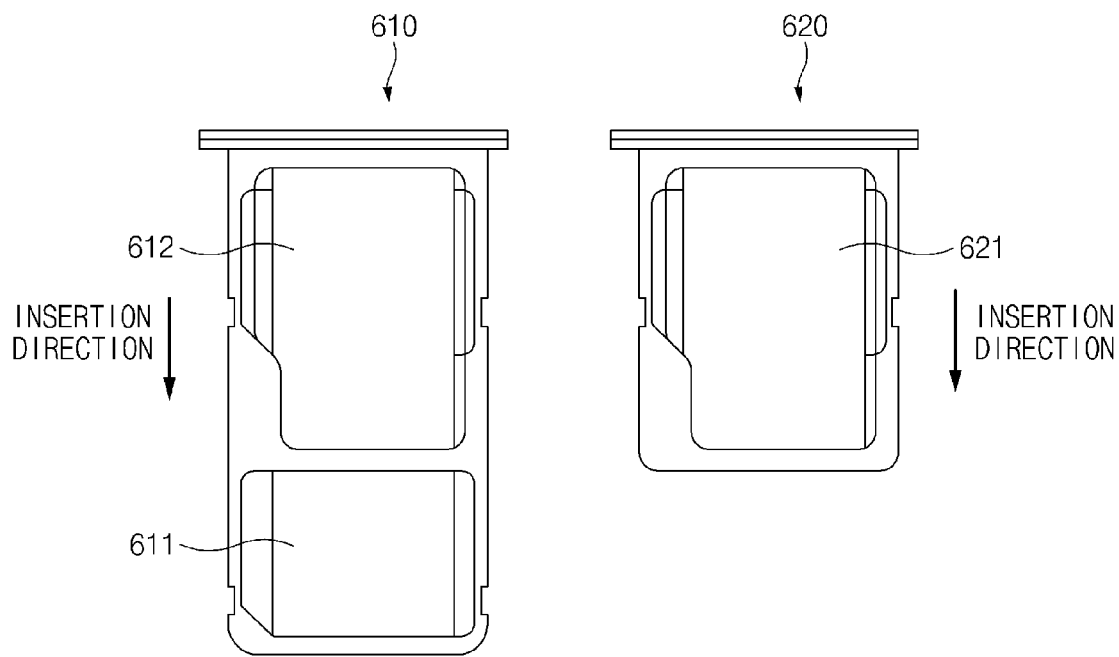
FIGS. 6A and 6B show various trays according to an embodiment of the present disclosure.
Figure 6B:
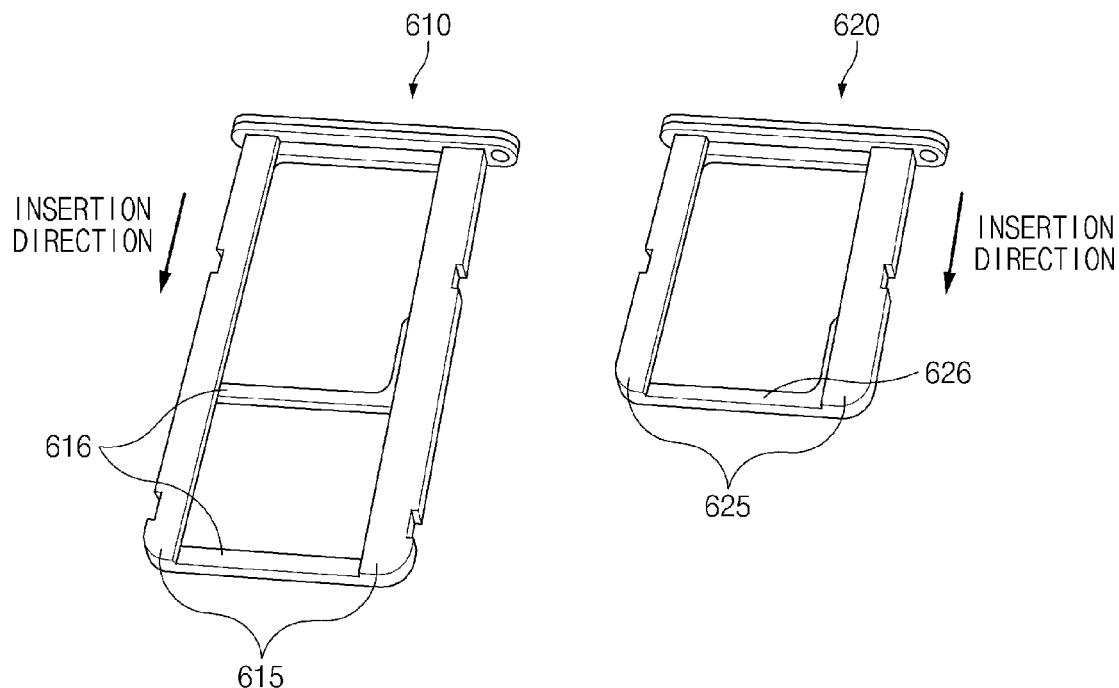
Figure 8:
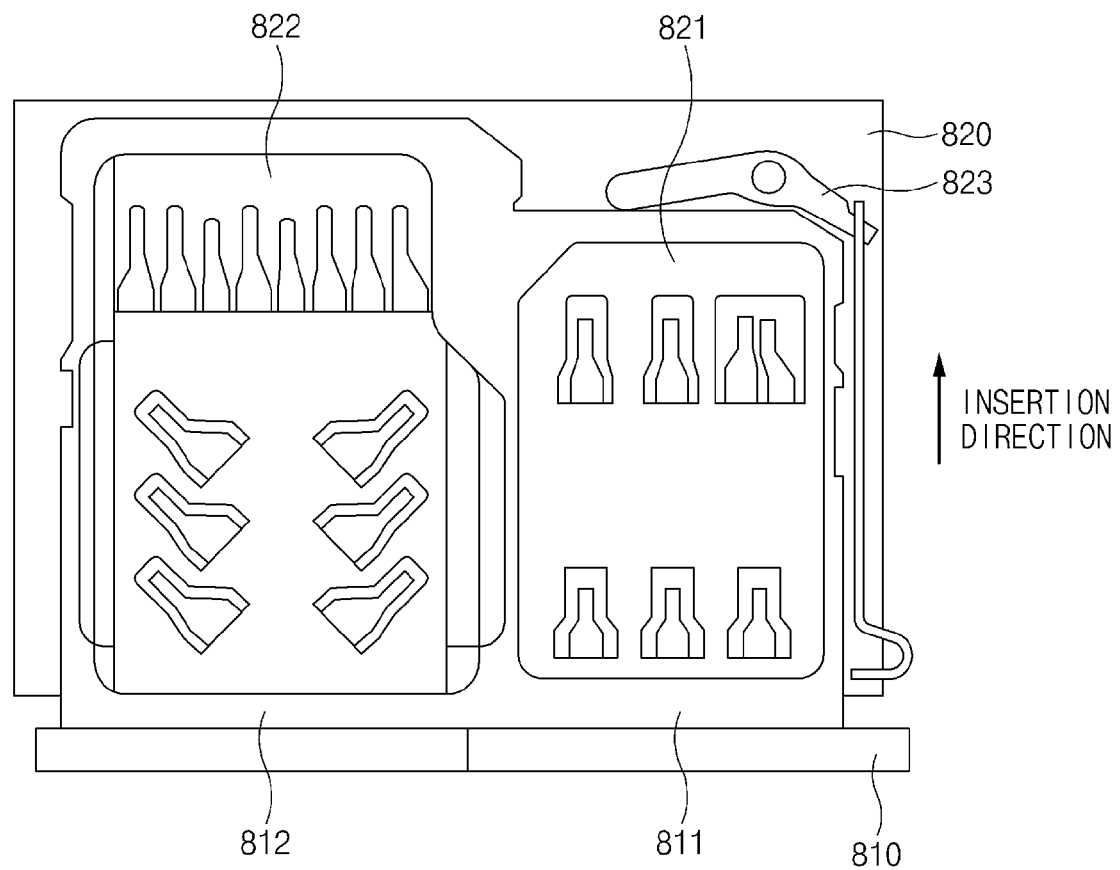
FIG. 8 shows a card connector and a tray according to an embodiment of the present disclosure.

The tray 210 may include a groove 213 formed therein. The groove 213 allows the tray 210 to be fixed in the card connector 310. The groove 213 is provided in one or more locations and is formed at a side surface portion of the tray 210, relative to an insertion direction of the tray 210, as shown in FIGS. 6A, 6B and 8. The groove 213 may be coupled to or separated from a support structure 315 formed at the side surface portion of the card connector 310.

Hereinafter, the first card area 211 will be described as a general card area in which a first card (e.g., USIM card 1) is installed and the second card area 212 will be described as the hybrid card area in which a second card (e.g., USIM card 2) or a third card (e.g., Micro SD card) is installed, though the present disclosure is not so limited.

The card connector 310 has a shape corresponding to the shape of the tray 210. The card connector 310 includes contact areas that are each electrically connected to a terminal of a corresponding card of the one or more cards that are inserted into the card connector 310 after being installed in the tray 210. For instance, if the tray 210 includes the hybrid card area among the card areas, the card connector 310 may include a contact area corresponding to the general card area and a contact area corresponding to the various cards installed in the hybrid area.

The card connector 310 includes the support structure 315, which couples with the groove 213 of the tray 210 such that the tray 210 is releaseably fixed in the card connector 310. If the tray 210 is inserted into the card connector 310, the support structure 315 is disposed at a position corresponding to a position of the groove 213. For instance, the support structure 315 is disposed at a side surface of the second card area 212 when the tray 210 is inserted into the card connector 310.

The support structure 315 can couple with the groove 213 disposed adjacent to the first card area 211, and the tray 210 is thereby maintained in a state in which the tray 210 is partially inserted into the card connector 310. Alternatively, the support structure 315 can couple to the groove 213 disposed adjacent to the second card area 212, and in this case, the tray 210 is maintained in a state in which the tray 210 is fully inserted into the card connector 310.

FIG. 3 shows only one support structure, but the number of the support structure is not so limited, and the electronic device 101 may include a plurality of support structures. As an example, the support structure 315 may be provided in a plural number of support structures, at both side surfaces of the card connector 310.

The support structure 315 may be integrally formed with or may be separate from the card connector 310. As an example, the support structure 315 may be integrally formed with the card connector 310 to form a portion of the card connector 310. As another example, the support structure 315 may be attached to the housing after being separately formed from the housing of the card connector 310. In this case, the support structure 315 may be coupled to or separated from the groove 213 of the tray 210 through a hole formed through the housing.

The card connector 310 may further include a tray recognition part to sense an insertion of the tray 210 and a tray discharge part to discharge the inserted tray 210, as described with reference to FIGS. 4 to 12.

Figure 4A:
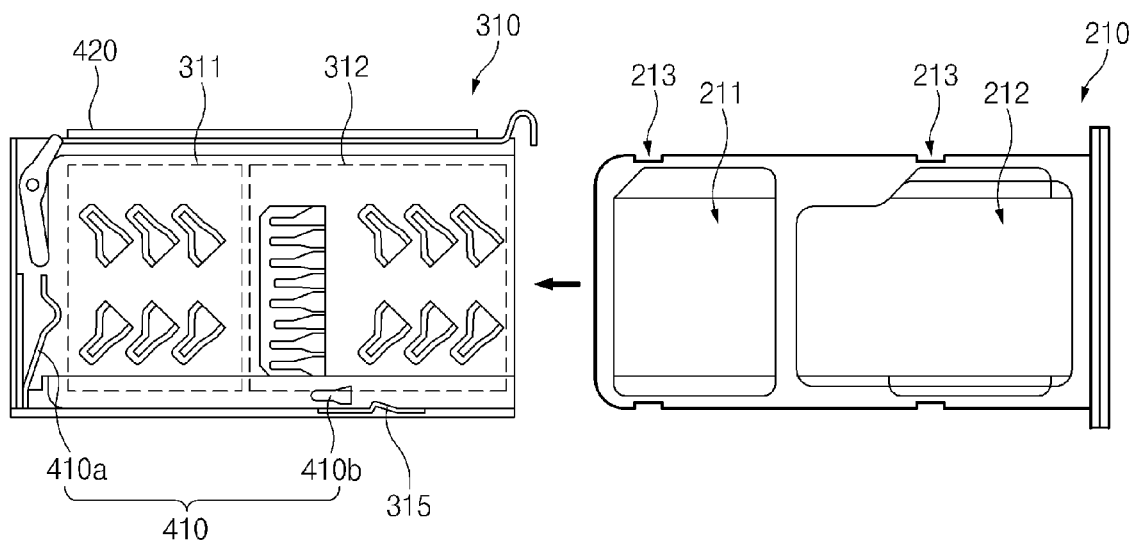
FIGS. 4A and 4B show an inner configuration of a card connector according to an embodiment of the present disclosure.
Figure 4B:
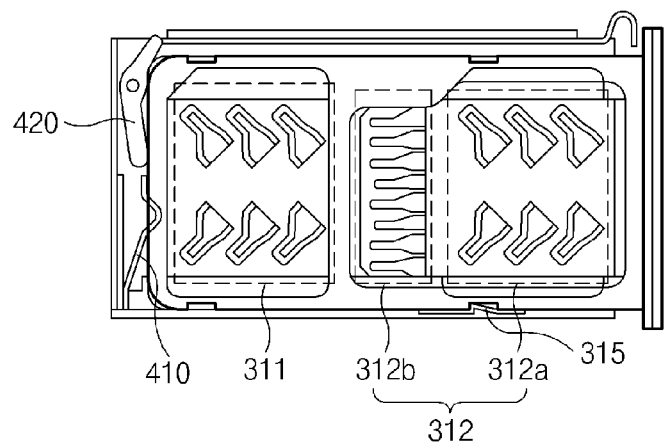

FIGS. 4A and 4B show an inner configuration of a card connector according to an embodiment of the present disclosure.

FIG. 4A shows the card connector and the tray, which are separated from each other, according to an embodiment of the present disclosure.

Referring to FIG. 4A, the card connector 310 includes a first contact area 311 and a second contact area 312. Each of the first and second contact areas 311 and 312 correspond to the card area of the tray 210. If the tray 210 includes the first card area 211 as the general card area and the second card area 212 as the hybrid card area, the first contact area 311 corresponds to the first card area 211 and the second contact area 312 corresponds to the second card area 212. The second contact area 312 includes a terminal corresponding to the second card, e.g., the USIM card 2, and the third card, e.g., the micro SD card, which are installed in the second card area that serves as the hybrid card area.

The card connector 310 may further include the tray recognition part 410 and the tray discharge part 420. The tray recognition part 410 senses whether the tray 210 is inserted and whether the card is installed. The tray recognition part 410 may include a first recognition part 410a and a second recognition part 420a. The first recognition part 410a senses whether the tray 210 is inserted into the first contact area 311 or whether the first card is installed. The second recognition part 410b senses whether the tray 210 is inserted into the second contact area 312 or whether the first and second cards are installed. The second recognition part 410b senses whether the tray 210 is partially inserted into the card connector 310 or whether a small tray that uses only the second contact area 312 is inserted.

Each of the first and second recognition parts 410a and 410b may be configured as a switch. If both the first and second recognition parts 410a and 410b are in an ON state, the electronic device 101 determines that the tray 210 is fully inserted into the card connector 310 and that each card area accommodates a corresponding card. If the first recognition part 410a is in an OFF state and the second recognition part 410b is in the ON state, the electronic device 101 determines that the tray 210 is partially inserted into the card connector 310, that the small tray that uses only the second contact area 312 is inserted, or that only the second contact area 312 accommodates a card. If both the first and second recognition parts 410a and 420b are in the OFF state, the electronic device 101 determines that the tray 210 is discharged or that a card is not installed on the tray 210.

The first and second recognition parts 410a and 410b shown in FIG. 4A are not limited to the above-described structure, and the position and shape of the tray recognition part 410 may vary. For instance, the tray recognition part 410 may be formed together with the first and second contact areas 311 and 312. Alternatively, if a portion of the tray 210 is opened, the tray recognition part 410 may make contact with the card installed in the opened area, to determine whether a card is installed or not.

FIG. 4B shows the card connector and the tray, which are coupled to each other, according to an embodiment of the present disclosure.

Referring to FIG. 4B, the tray 210 is inserted into the card connector 310. The card installed in the first card area 211 is electrically connected to the tray 210 through terminals included in the first contact area 311. The card installed in the second card area 212 is electrically connected to the tray 210 through terminals included in the second contact area 312.

If the second card area 212 is the hybrid card area, the second contact area 312 electrically connects to the second card (e.g., USIM card 2) or the third card (e.g., micro SD card) through sub-contact areas 312a and 312b. For instance, the sub-contact area 312a may include a terminal connected to the second card (e.g., USIM card 2) and the sub-contact area 312b may include a terminal connected to the third card (e.g., Micro SD card). The sub-contact areas 312a and 312b are independently disposed from each other in the second contact area 312.

The tray recognition part 410 checks for insertion of the tray 210, i.e., the insertion state of the tray 210. The first recognition part 410a checks whether the tray 210 is inserted into the first contact area 311. The second recognition part 410b checks whether the tray 210 is inserted into the second contact area 312.

The tray discharge part 420 discharges the tray 210 inserted in the card connector 310. For instance, the tray discharge part 420 discharges the tray 210 when a force caused by manipulating a pin or the like is applied thereto. The tray discharge part 420 operates in a push-push button manner, as described in detail with reference to FIGS. 10A to 10E.

Figure 5:
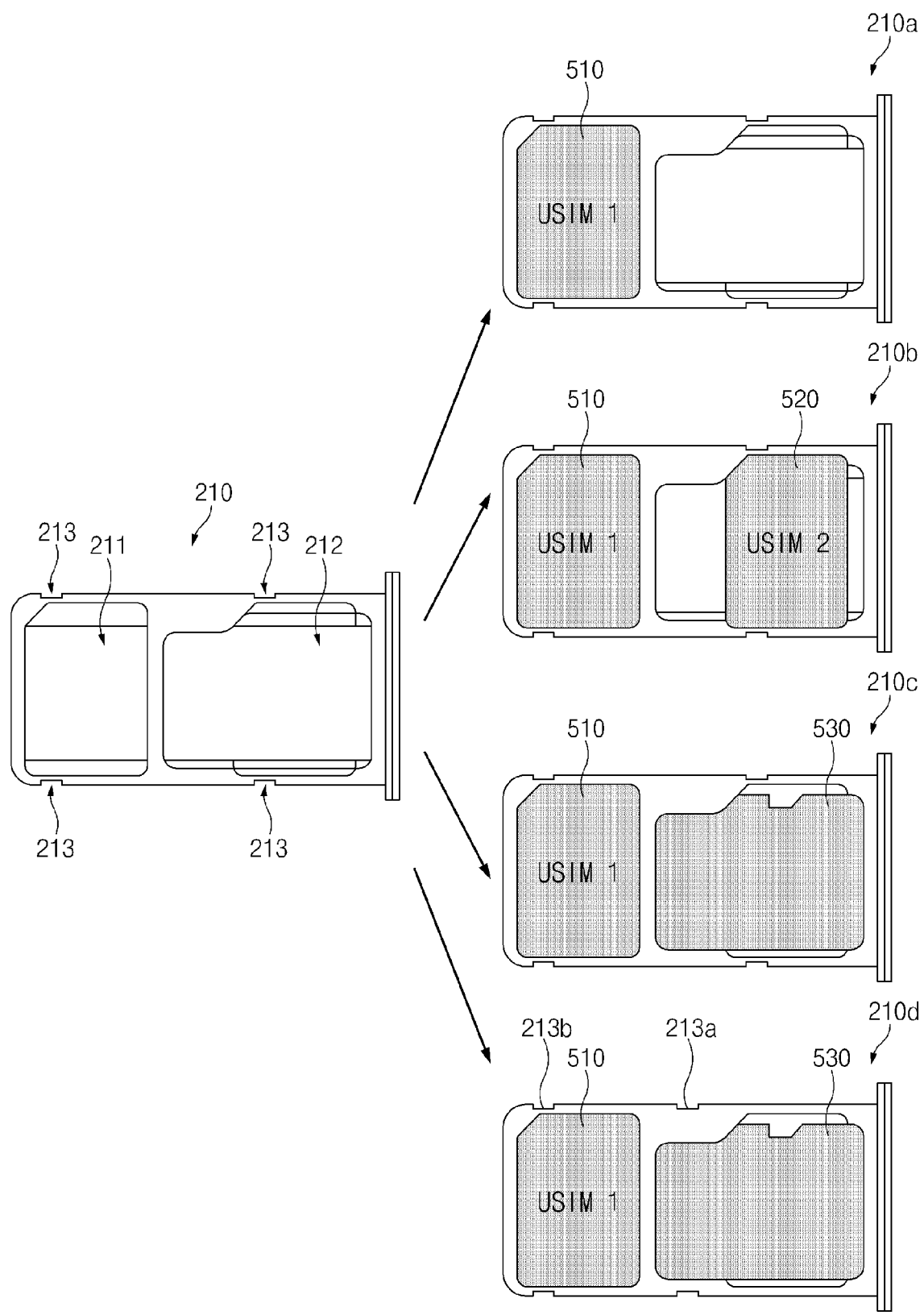
FIG. 5 shows a tray accommodating cards according to an embodiment of the present disclosure.

FIG. 5 shows a tray accommodating cards according to an embodiment of the present disclosure.

Referring to FIG. 5, the tray 210 includes a first card area 211 and a second card area 212. At least one of the first and second card areas 211 and 212 may be provided as the hybrid card area, e.g., the second card area 212. A first card 510 (e.g., SIM card 1) may be installed in the first card area 211 and a second card 520 (e.g., USIM card 2) or a third card 530 (e.g., Micro SD card) may be installed in the second card area 212.

In a tray 210a, the user may install the first card 510 (e.g., USIM card 1) in the first card area 211, without installing any card in the second card area 212. The electronic device 101 will sense the insertion of the tray 210a through the tray recognition part 410. The first contact area 311 of the card connector 310 electrically connects to the first card 510 (e.g., USIM card 1), and the electronic device 101 transmits/receives data based on subscriber information stored in the first card 510 (e.g., USIM card 1). The second contact area 312 does not recognize an inserted card, and a separate operation is therefore not performed.

In a tray 210b, the user may install the first card 510 (e.g., USIM card 1) in the first card area 211 and the second card 520 (e.g., USIM card 2) in the second card area 212. The electronic device 101 senses insertion of the tray 210b through the tray recognition part 410. The first contact area 311 of the card connector 310 electrically connects to the first card 510 (e.g., USIM card 1) and the second contact area 312 of the card connector 310 electrically connects to the second card 520 (e.g., USIM card 2). The electronic device 101 transmits/receives data based on subscriber information stored in the first card 510 (e.g., USIM card 1) and/or in the second card 520 (e.g., USIM card 2). The user may selectively use different subscriber information in the single electronic device, without having to exchange cards.

In a tray 210c, the user may install the first card 510 (e.g., USIM card 1) in the first card area 211 and the third card 530 (e.g., Micro SD card) in the second card area 212. The electronic device 101 senses the insertion of the tray 210c through the tray recognition part 410. The first contact area 311 of the card connector 310 electrically connects to the first card 510 (e.g., USIM card 1) and the second contact area 312 of the card connector 310 electrically connects to the third card 520 (e.g., Micro SD card 2). The electronic device 101 transmits/receives data based on subscriber information stored in the first card 510 (e.g., USIM card 1). The electronic device 101 may retrieve, utilize and/or store data in the third card 530 (e.g., Micro SD card 2).

A tray 210*d* may include a first groove 213*a* and a second groove 213*b*. The first and second grooves 213*a* and 213*b* allow the tray 210 to be fixed at various positions in the card connector 310. One or more grooves of the first and second grooves 213*a* and 213*b* are formed at a left or right side surface with respect to the insertion direction, as shown in FIGS. 6A, 6B and 8, of the tray 210. The first and second grooves 213*a* and 213*b* couple to and separate from the support structure 315 formed at the side surface of the card connector 310. The second groove 213*b* is disposed adjacent to the first card area 211 and the first groove 213*a* is disposed adjacent to the second card area 212.

Positions of the first and second grooves 213*a* and 213*b* may change depending on the shape of the tray 210*d*. Different from the position of the groove in the trays 210*a* to 210*c*, the first groove 213*a* of the tray 210*d* is disposed at a portion of maximum width in the side surface of the second card area 212. For instance, the first groove 213*a* may be disposed at a position adjacent to a boundary between the first card area 211 and the second card area 212, when compared with the position of the groove in the trays 210*a* to 210*c*. When the first groove 213*a* is disposed at a position of maximum width of the tray 210, a crack may be prevented from occurring in the tray 210*d* even though the width of the tray 210*d* is reduced due to the first groove 213*a*. However, the first and second grooves 213*a* and 213*b* are not so limited and may be disposed at various positions according to a design environment or a manufacturing environment.

FIGS. 6A and 6B show various trays according to an embodiment of the present disclosure.

FIG. 6A shows a front surface portion of trays according to an embodiment of the present disclosure.

Referring to FIG. 6A, a tray 610 includes a first card area 611 and a second card area 612. The first card area 611 may be a general card area in which a single card (e.g., USIM card) may be installed and the second card area 612 may be a hybrid card area in which various cards (e.g., USIM card or Micro SD card) may be selectively installed. The first and second card areas 611 and 612 may be sequentially arranged in the insertion direction of the tray 610. The first card area 611 may be disposed such that the first card area 611 is inserted to a greater depth into the electronic device 101 than the second card area 612.

Referring to FIG. 6B, a tray 620 may include only one card area 621 realized as a hybrid structure. The various cards (e.g., USIM card or Micro SD card) may be selectively installed in the card area 621. If the tray 620 is inserted into the card connector 310, the second contact area 312 electrically connects to the USIM card or Micro SD card installed in the card area 621 and the first contact area 311 will not separately operate.

The tray is not be limited to the trays 610 and 620, as shown in FIG. 6A. The electronic device 101 may be operated to correspond to various cases related to the insertion of the tray by only using one card connector 310, and thus the space utilization efficiency of the electronic device 101 may be improved by the hybrid card area.

FIG. 6B shows a rear surface portion of trays according to an embodiment of the present disclosure.

Referring to FIG. 6B, the tray 610 may include a first supporter 615 formed in the insertion direction of the tray 610 and a second supporter 616 formed in a direction substantially perpendicular to the insertion direction of the tray 610. The first and second supporters 615 and 616 may have a step difference in height, with the second supporter 616 being disposed above the first supporter 615 at a height higher than a predetermined height, and the card installed on the tray 610 may be disposed on the second supporter 616. The second supporter 616 may have the predetermined height to prevent the second supporter 616 from colliding with or from being stuck to the terminal of the contact area of the card connector 310.

Similar to the first tray 610, the tray 620 may include a first supporter 625 formed in the insertion direction of the tray 620, but with only one second supporter 626 formed in a direction substantially perpendicular to the insertion direction of the tray 620, with the first and second supporters 625 and 626 having a step difference.

FIG. 7 shows a tray inserted into a card connector according to an embodiment of the present disclosure.

Referring to FIG. 7, a tray 610 includes a first card area 611 and a second card area 612. The first card area 611 may be a general card area in which a single card (e.g., USIM card) may be installed and the second card area 612 may be a hybrid card area in which various cards (e.g., USIM cards or Micro SD cards) may be selectively installed.

The tray 610 may be inserted into a card connector 710. The card connector 710 includes a first contact area 711 and a second contact area 712. The first contact area 711 electrically connects to the card installed in the first card area 611 and the second contact area 712 electrically connects to the card installed in the second card area 612. The second contact area 712 includes terminals required by each various card type, to provide the hybrid structure.

Similar to the tray 610, a tray 620 is inserted into the card connector 710. The tray 620 includes only one card area 621 realized as the hybrid structure. The various cards (e.g., USIM cards or Micro SD cards) may be selectively installed in the card area 621. The USIM card or Micro SD card installed on the tray 620 may be electrically connected to the electronic device 101 through a second contact area 712 of the card connector 710. In this case, a card is not inserted in the first contact area 711.

The card connector 710 further includes a tray recognition part 713 to sense the tray 610 or 620. The tray recognition part 713 may include a plurality of recognition parts, e.g., the first and second recognition parts 410*a* and 410*b* shown in FIG. 4. The electronic device 101 determines a type of tray (e.g., the tray 610 or 620) inserted thereinto in accordance with the recognized result by each recognition part.

The tray discharge part 714 is disposed adjacent to an inlet of the card connector 710, which is connected to the opening portion 110. When the user pushes the tray discharge part 714 using a pin 750, the tray discharge part 714 moves about its axis to eject the tray 610 or 620. The tray discharge part 714 may alternatively be disposed at an end portion of the tray 610 or the tray 620.

FIG. 8 shows a card connector and a tray according to an embodiment of the present disclosure.

Referring to FIG. 8, a tray 810 includes a first card area 811 and a second card area 812. The first and second card areas 811 and 812 are disposed side by side, i.e., at left and right portions, with respect to the insertion direction. The second card area 812 may be realized as a hybrid structure, and thus various cards may be installed in the second card area 812, though the second card area 812 is not so limited. That is, the first card area 811 may be realized as the hybrid card area or all of the first and second card areas 811 and 812 may be realized as the hybrid area.

A card connector 820 includes a first contact area 821 and a second contact area 822. The first and second contact areas 821 and 822 are correspondingly disposed at left and right portions with respect to the insertion direction. The second contact area 822 includes terminals corresponding to the second card area 812 that is the hybrid card area.

The card connector 820 may further include a tray recognition part that senses whether the tray 810 is inserted. The tray recognition part may be disposed at an edge of the first contact area 821 or the second contact area 822.

The card connector 820 further includes a tray discharge part 823, to discharge the tray 810 inserted therein. In FIG. 8, the tray discharge part 823 is disposed adjacent to the first contact area 821, but may be positioned elsewhere, such as adjacent to the second contact area 822.

Figure 9A:
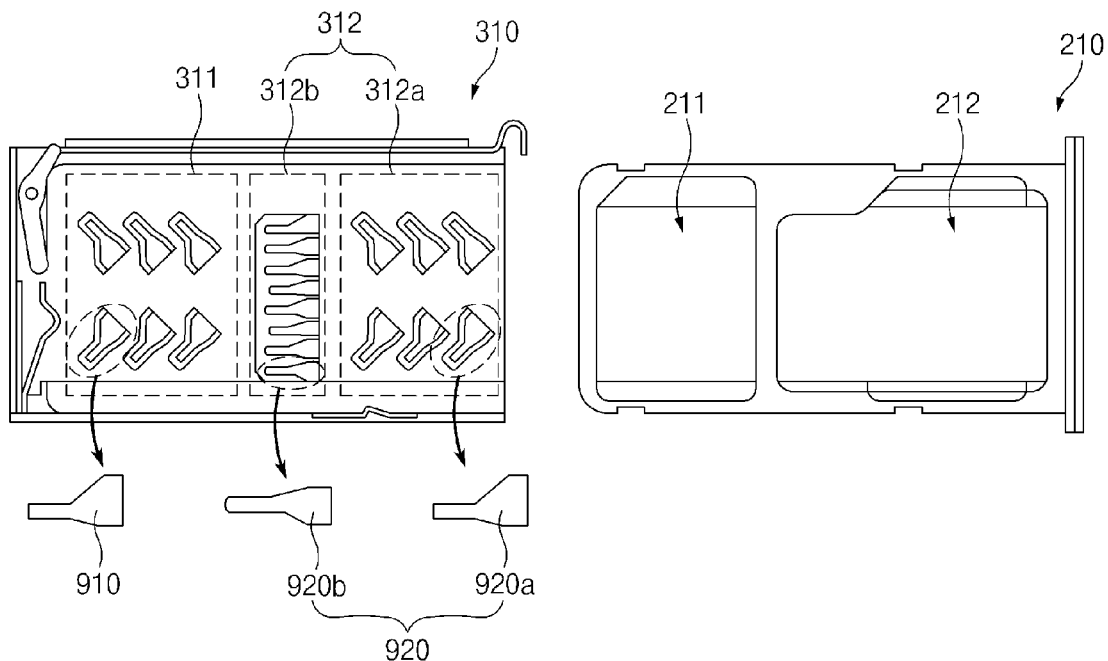
FIGS. 9A to 9C show a contact structure of a card connector according to an embodiment of the present disclosure.
Figure 9B:
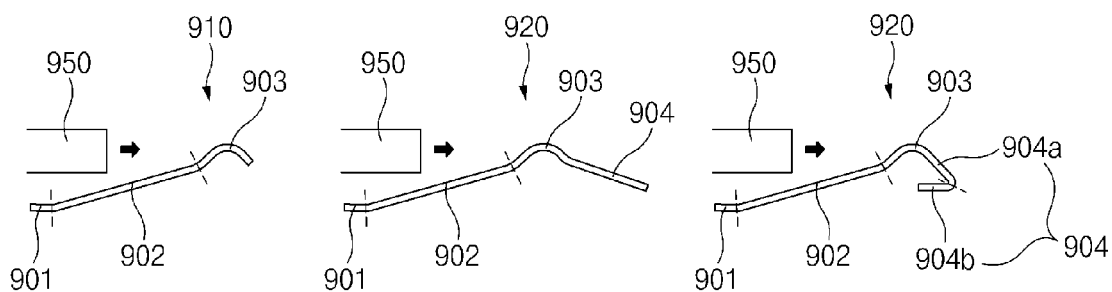
Figure 9C:
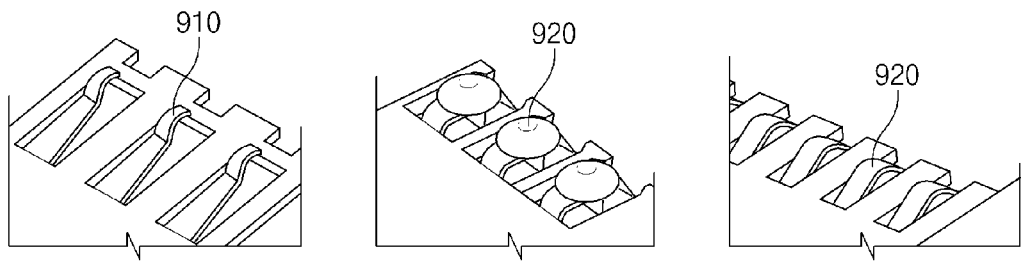

FIGS. 9A to 9C show a contact structure of a card connector according to an embodiment of the present disclosure.

FIG. 9A shows a shape of a terminal included in each contact area.

Referring to FIG. 9A, a card connector 310 includes a first contact area 311 and a second contact area 312. The first contact area 311 corresponds to a first card area 211 (single card area) of a tray 210. The first contact area 311 includes a terminal 910. The terminal 910 may be electrically connected to a first card (e.g., USIM card 1) installed in the first card area 211 of the tray 210. The terminal 910 has a shape that corresponds to the first card. Detailed descriptions of the terminal 910 are provided with reference to FIGS. 9B and 9C.

The second contact area 312 corresponds to a second card area 212, i.e., the hybrid card area, and includes a terminal 920. The second contact area 312 may include sub-contact areas 312a and 312b corresponding to the second card area 212 that is the hybrid card area. The sub-contact areas 312a and 312b include terminals 920a and 920b, respectively. The terminal 920a electrically connects to the second card (e.g., USIM card 2) installed in the second card area 212. The terminal 920b electrically connects to the third card (e.g., Micro SD card) installed in the second card area 212.

The terminal 920 is easily connected to the second card or the third card. In addition, the terminal 920 allows the first card to be inserted into the first contact area 311 after passing through the second contact area 312, and allows for easy insert and discharge. Detailed descriptions of the terminal 920 will be described with reference to FIGS. 9B and 9C.

FIG. 9B is a cross-sectional view of the terminal included in each contact area.

Referring to FIG. 9B, the terminal 910 is included in the first contact area 311 and includes a fixing part 901, a supporting part 902, and a bending part 903, which are flexible and elastic, and resume a normal shape after stretching or compression. The fixing part 901 is fixedly attached to the terminal 910 in the first contact area 311. The supporting part 902 extends from the fixing part 901 in a predetermined direction, and flexibly supports the bending part 903 using an elasticity thereof. The supporting part 902 moves downward when a card 950 is inserted, and moves upward when the card 950 is discharged. The bending part 903 bends downward at a predetermined angle. The bending part 903 directly contacts the card 950 to transmit/receive an electrical signal to/from the card 950. The bending part 903 is bent at the predetermined angle or has a predetermined curvature to prevent the card 950 from colliding with or from being stuck to the bending part 903.

The terminal 920 included in the second contact area 312 includes a fixing part 901, a supporting part 902, a bending part 903, and an extending part 904. The terminal 920 may have substantially the same structure and function as those of the terminal 910, except for the extending part 904. The fixing part 901, the supporting part 902, and the bending part 903 may have substantially the same structure and function as those of the terminal 910.

The extending part 904 extends from the bending part 903 and additionally extends to a lower portion of the terminal 920. The extending part 904 allows the first card to be inserted into the first contact area 311, after passing through the second contact area 312, without colliding with or becoming stuck to the terminal 920.

The extending part 904 may be realized in a straight line shape extending toward the lower portion of the terminal 920 at the predetermined angle. Alternatively, the extending part 904 may be realized in a circular shape that includes a first extending part 904a and a second extending part 904b.

FIG. 9C is a perspective view showing terminals included in the contact area according to an embodiment of the present disclosure.

Referring to FIG. 9C, the terminal 910 or the terminal 920 included in the contact area may be realized in various shapes. The fixing part 901, the supporting part 902, and the bending part 903 included in the terminal 910 or the terminal 920 may have various widths and thicknesses in consideration of the necessity of changes in design and/or function. The bending part 903 may have various shapes, e.g., a straight line shape, a curved line shape, a circular shape, etc., such that the bending part 903 easily makes contact with or is easily separated from the card 950. The bending part 903 may be realized in a shape to allow the bending part 903 not to be stuck to the card 950.

The terminals 910 and 920 shown in FIGS. 9A, 9B, and 9C should not be limited to the above-mentioned structure and function, and may have a variety of shapes to correspond to the card installed in the tray 210. For instance, the terminal 910 may be realized as including the extending part 904 as the terminal 920.

FIGS. 10A to 10E show a tray discharge structure operated in a push-push button manner according to an embodiment the present disclosure.

Figure 10A:
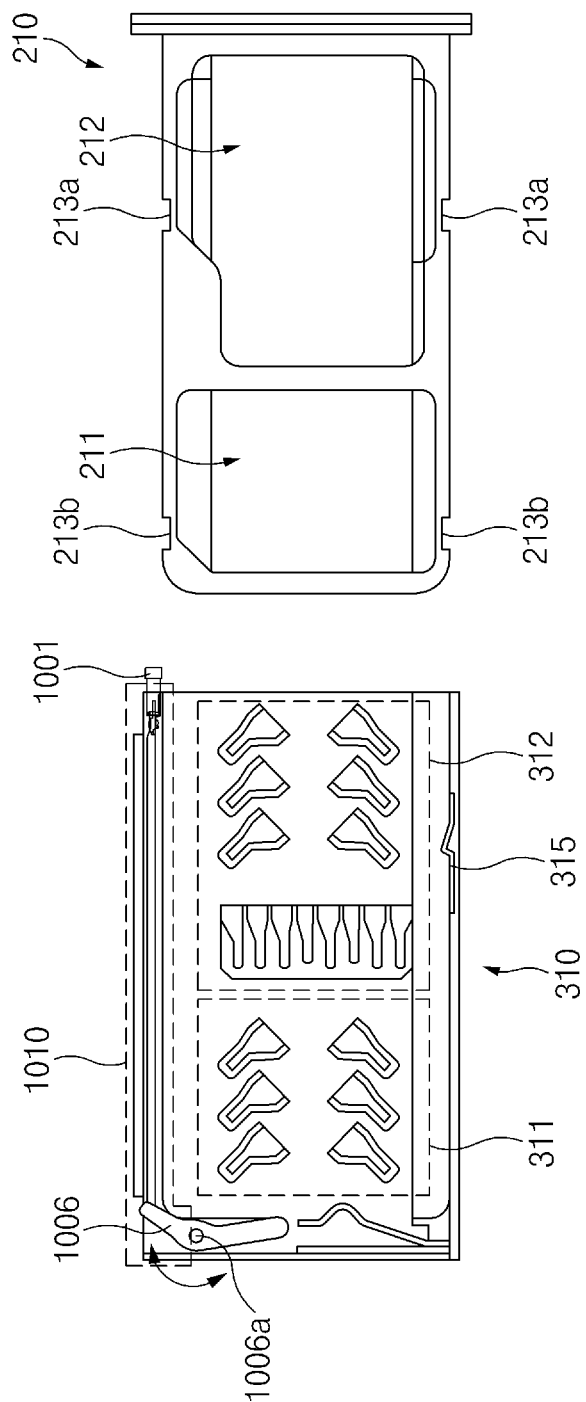
FIGS. 10A to 10E show a tray discharge structure operated in a push-push manner according to an embodiment of the present disclosure.

Referring to FIG. 10A, the card connector 310 includes a first contact area 311 and a second contact area 312. The first contact area 311 corresponds to a first card area 211, i.e., a single card area, of a tray 210 and the second contact area 312 corresponds to a second card area 212, i.e., a hybrid card area.

After the tray 210 is inserted, the user may discharge the tray 210 through a tray discharge part 1010, which operates in the push-push button manner.

As shown in FIGS. 10B to 10E, the tray discharge part 1010 includes a button 1001, a latch bracket 1002, a fixing part 1003, a moving part 1004, an elastic part 1005, and a discharge part 1006.

Figure 10B:
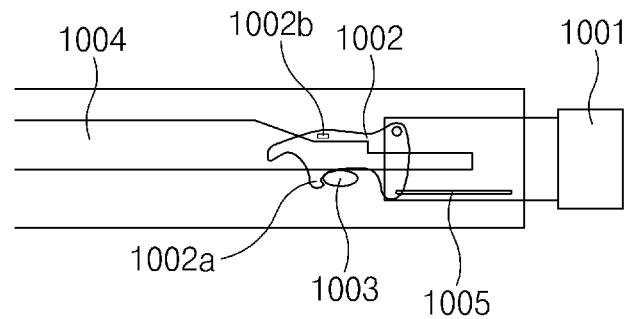

As shown in FIG. 10B, when the tray 210 is inserted into the card connector 210, the button 1001 outwardly protrudes from the electronic device within a predetermined range. Before the user presses the button 1001, the latch bracket 1002 is maintained in a state in which a first hook 1002a is hooked to the fixing part 1003 by the elasticity of the elastic part 1005.

Figure 10C:
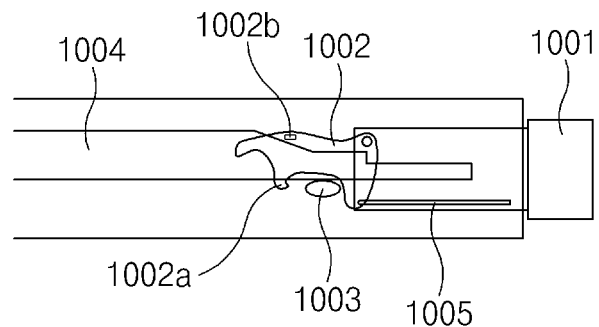
Figure 10D:
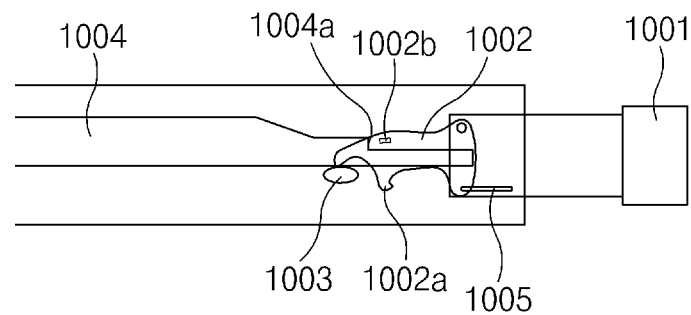

As shown in FIG. 10C, when the user presses the button 1001 once, the latch bracket 1002 moves along its axis and is released from the fixing part 1003. Accordingly, as shown in FIG. 10D, the latch bracket 1002 is maintained in a state in which a second hook 1002b is hooked to a stepped portion 1004a of the moving part 1004.

Figure 10E:
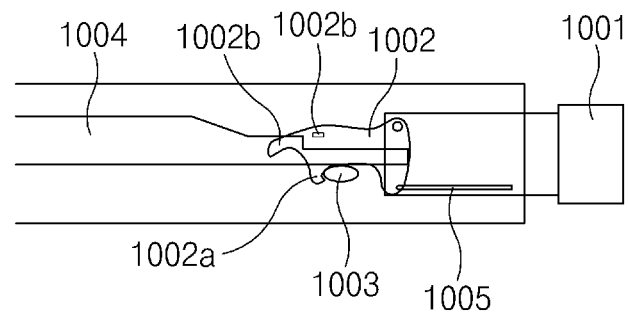

As shown in FIG. 10E, when the user presses the button 1001 while the latch bracket 1002 is hooked to the stepped portion 1004a, the discharge part 1006 pivots along axis 1006a by the movement of the moving part 1004, and the tray 210 is moved outward from the electronic device 101 by a force exerted by the movement of the discharge part 1006 from a state in which the first groove 213a is coupled to the support structure 315 to a state in which the second groove 213b is coupled to the support structure 315.

The latch bracket 1002 moves along its axis and the moving part 1004 moves with the latch bracket 1002, which returns to the state in which the first hook 1002a is hooked to the fixing part 1003.

Figure 11:
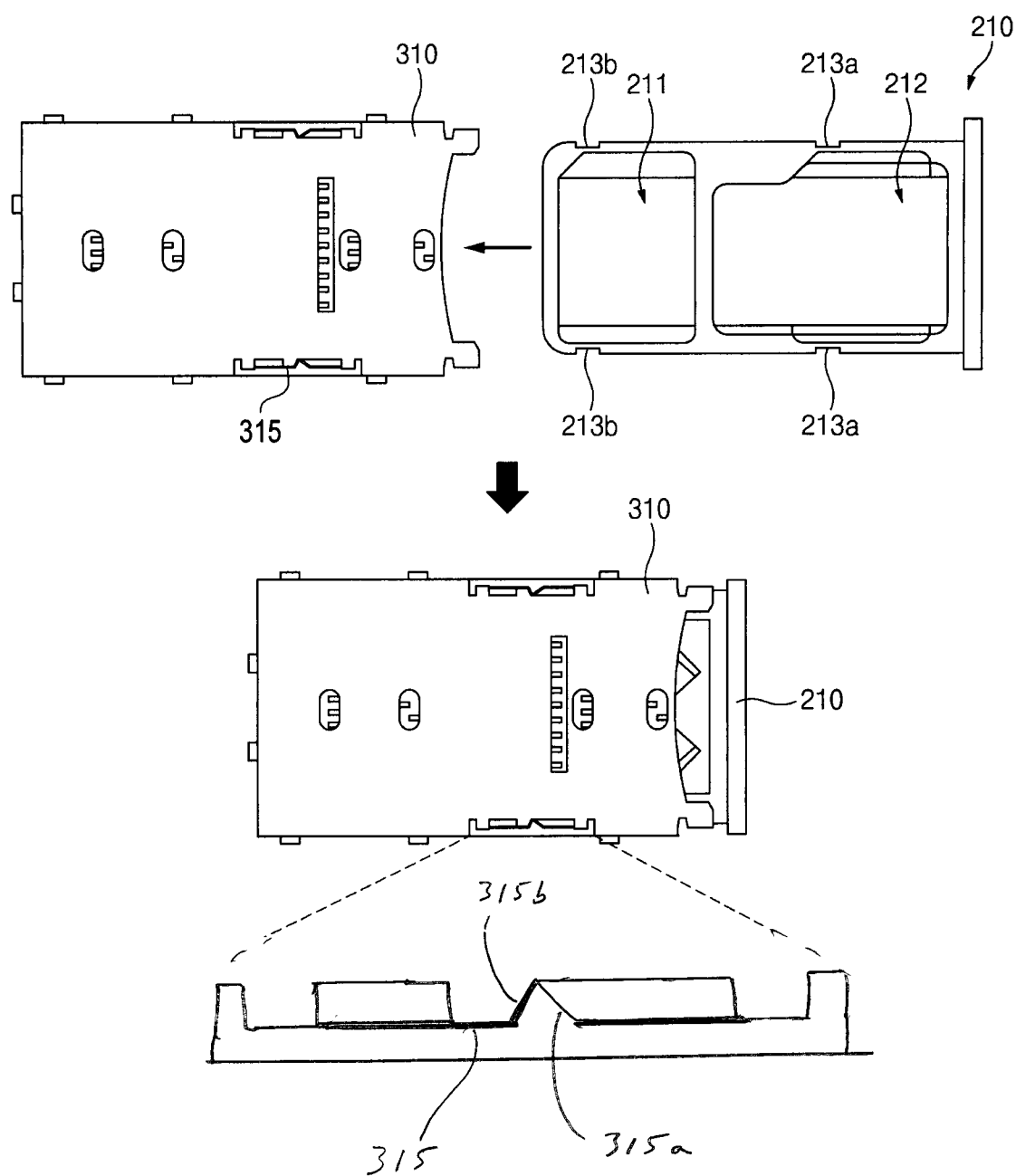
FIG. 11 shows a support structure of a card connector according to an embodiment of the present disclosure.

FIG. 11 shows a support structure of a card connector according to an embodiment of the present disclosure.

Referring to FIG. 11, a card connector 310 includes a support structure 315 on its side surface. The support structure 315 prevents the tray 210 from moving in the card connector 310 after the tray 210 is inserted into the support structure 315.

When the tray 210 is inserted into the card connector 310, the support structure 315 may not be coupled to one of the first and second grooves 213a and 213b, and the support structure 315 may be coupled to the first and second grooves 213a and 213b when the tray 210 is discharged to the outside of the card connector 310. The support structure 315 includes a surface 315a forming a first angle, which is a obtuse angle, with the side surface in the insertion direction of the tray 210 and a surface 315b forming a second angle, which is a right angle or greater, with the side surface in the discharge direction of the tray 210.

The first groove 213a may be coupled to the support structure 315 when the tray 210 is fully inserted into the card connector 210. The tray 210 may be securely fixed in the card connector 310 due to the coupling between the support structure 315 and the first groove 213a.

The user may replace or remove the card installed in the second card area 212 when the tray 210 is partially discharged from the card connector 310, i.e., the state in which the support structure 315 is coupled to the second groove 213b. The user may easily replace the card installed in the hybrid card area with another card, even though the tray 210 is not completely separated from the card connector 310. The electronic device 101 recognizes the card installed in the tray 210 when the tray 210 is partially discharged from the card connector 310. The state in which the tray 210 is fully inserted into the card connector 310, i.e., with the support structure 315 coupled to the first groove 213a, may change to the state in which the tray 210 is partially discharged from the card connector 310 through the tray discharge part, e.g., when the support structure 315 is coupled to the second groove 213b. When the first card installed in the first card area 211 moves to the second card area 212 in the first contact area, the electronic device 101 electrically connects to the first card through the second contact area.

In an embodiment of the present disclosure, the electronic device accommodates a plurality of cards and includes the first contact area through which the electronic device is connected to the first card among the cards and the second contact area through which the electronic device is connected to the second card or the third card.

In an embodiment of the present disclosure, the second contact area includes the first sub-contact area connected to the second card and the second sub-contact area connected to the third card, with the first and second sub-contact areas independently disposed in the second contact area. The second contact area includes the terminals connected to the second and third cards.

In an embodiment of the present disclosure, each terminal includes the fixing part, the supporting part connected to the fixing part and extending from the fixing part in a predetermined direction with the support part having an elasticity, the bending part connected to the supporting part to make contact with one of the second card and the third card, and the extending part extending in the predetermined direction from the bending part.

In an embodiment of the present disclosure, the second contact area is spaced apart from a center portion of the electronic device, with the second contact area positioned further away from the center portion than the first contact area. Each of the first and second cards may be the subscribed identification card, and the third card may be the memory card.

In an embodiment of the present disclosure, the electronic device includes the tray that accommodates a plurality of cards therein and a card connector accommodates the tray, with the card connector including the first card area that electrically connects the electronic device to the first card installed in the first card area and the second card area that selectively electrically connects the electronic device to the second card and the third card, which is installed in the second card area.

In an embodiment of the present disclosure, the first and second contact areas are arranged in a same direction in which the tray is inserted or discharged. In addition, the first and second contact areas may be arranged in a direction that is substantially perpendicular to the insertion direction of the tray.

In an embodiment of the present disclosure, the card connector further includes a tray discharge part that operates to discharge the tray and a tray recognition part to recognize the tray. The tray discharge part may be operated in the push-push button manner.

In an embodiment of the present disclosure, the tray includes the first and second grooves formed on the side surface thereof and the card connector includes the support structure coupled to the first and second grooves. The first groove is disposed adjacent to the second card area on the side surface of the tray and the second groove is disposed adjacent to the first card area on the side surface of the tray. The first groove may be disposed at the position having a relatively large area or width in the side surface of the second card area.

In an embodiment of the present disclosure, if the first card area and second card area are inserted into the card connector, the support structure is coupled to the first groove, and if the second card area is partially discharged from the card connector, the support structure is coupled to the second groove. The support structure may be disposed on the side surface of the second contact area and coupled to the first groove or the second groove.

In an embodiment of the present disclosure, the tray has the stepped structure, to prevent the tray from colliding with the first or second contact area.

In an embodiment of the present disclosure, the tray accommodates the cards inserted into the electronic device and includes the first card area in which the first card is installed and the second card area in which one of the second and third cards is installed. The first and second card areas may be sequentially arranged in the direction into which the tray is inserted into the electronic device, and the first card area may be inserted into the electronic device prior to the second card area.

In an embodiment of the present disclosure, the tray includes the first and second grooves formed on the side surface thereof and the first groove is disposed at the position having the relatively large area or width in the side surface of the second card area.

Figure 12:
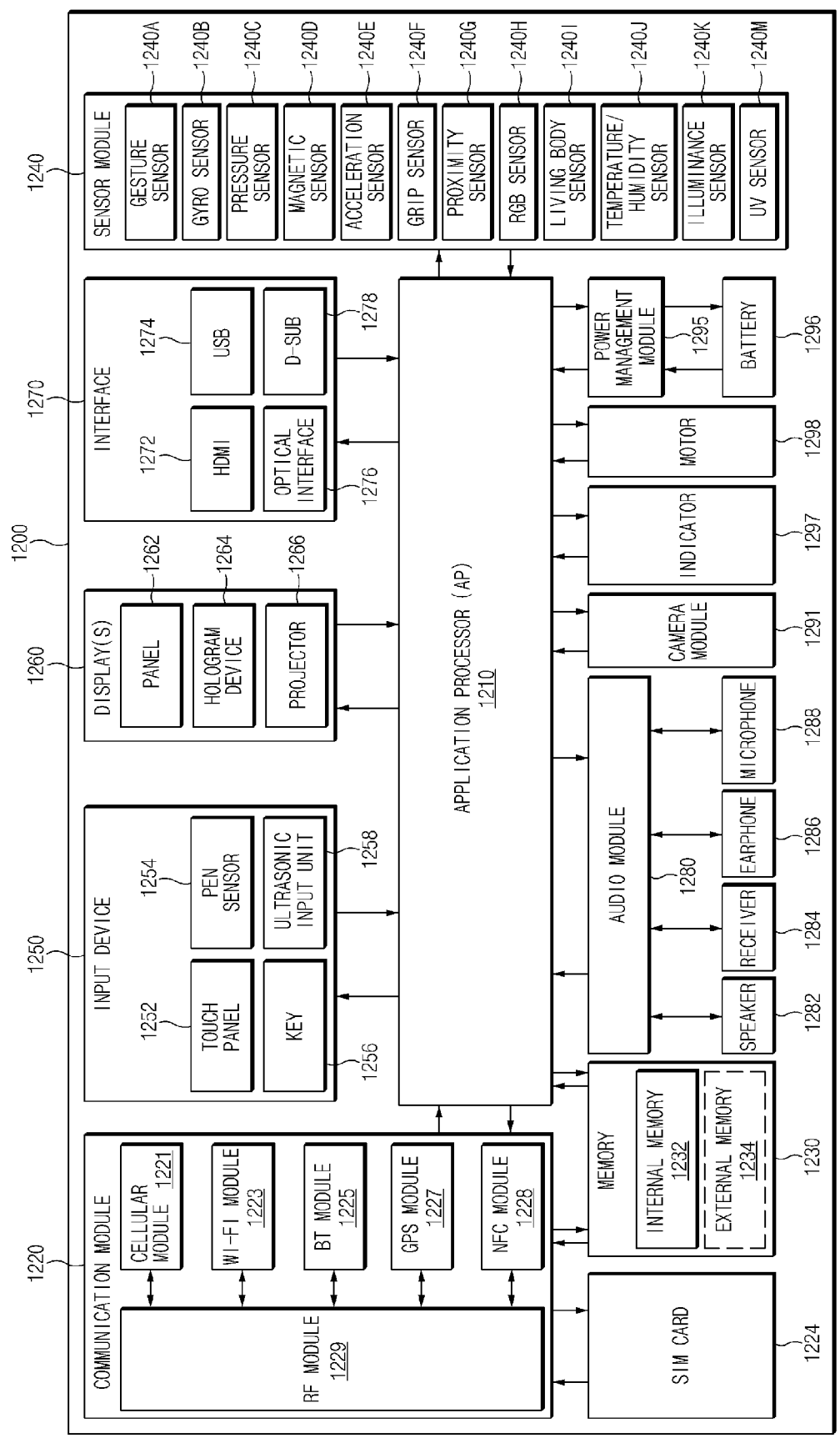
FIG. 12 is a block diagram illustrating an electronic device according to an embodiment of the present disclosure.

FIG. 12 is a block diagram illustrating an electronic device 1200 according to an embodiment of the present disclosure.

Referring to FIG. 12, an electronic device 1200 may include, for example, all or a part of an electronic device 101, as illustrated in FIG. 1. The electronic device 1200 may include one or more application processors (APs) 1210, a communication module 1220, a SIM card 1224, a memory 1230, a sensor module 1240, an input device 1250, a display 1260 (e.g., the display 160), an interface 1270, an audio module 1280, a camera module 1291, a power management module 1295, a battery 1296, an indicator 1297, and a motor 1298.

The AP 1210 may drive an operating system (OS) or an application to control a plurality of hardware or software components connected to the AP 1210 and may process and compute a variety of data. The AP 1210 may be implemented with a System on Chip (SoC), for example. According to the present disclosure, the AP 1210 may further include a graphic processing unit (GPU) and/or an image signal processor. The AP 1210 may include at least a part (e.g., a cellular module 1221) of components illustrated in FIG. 2. The AP 1210 may load and process an instruction or data, which is received from at least one of other components (e.g., a nonvolatile memory), and may store a variety of data at a nonvolatile memory.

The communication module 1220 may be configured the same as or similar to a communication interface 170 of FIG. 1. The communication module 1220 may include a cellular module 1221, a wireless-fidelity (Wi-Fi) module 1223, a Bluetooth (BT) module 1225, a global positioning system (GPS) module 1227, a near field communication (NFC) module 1228, and a radio frequency (RF) module 1229.

The cellular module 1221 may provide voice communication, video communication, a character service, an Internet service or the like through a communication network. According to the present disclosure, the cellular module 1221 may perform discrimination and authentication of an electronic device 1200 within a communication network using the SIM card 1224, for example. According to the present disclosure, the cellular module 1221 may perform at least a portion of functions that the AP 1210 provides. The cellular module 1221 may include a communication processor (CP).

Each of the Wi-Fi module 1223, the BT module 1225, the GPS module 1227, and the NFC module 1228 may include a processor for processing data exchanged through a corresponding module, for example. At least a portion (e.g., two or more components) of the cellular module 1221, the Wi-Fi module 1223, the BT module 1225, the GPS module 1227, and the NFC module 1228 may be included within one Integrated Circuit (IC) or an IC package.

The RF module 1229 may transmit and receive a communication signal (e.g., an RF signal). The RF module 1229 may include a transceiver, a power amplifier module (PAM), a frequency filter, a low noise amplifier (LNA), an antenna, or the like. At least one of the cellular module 1221, the Wi-Fi module 1223, the BT module 1225, the GPS module 1227, and the NFC module 1228 may transmit and receive an RF signal through a separate RF module.

The SIM card 1224 may include, for example, a subscriber identification module and may include unique identify information (e.g., integrated circuit card identifier (IC-CID)) or subscriber information (e.g., integrated mobile subscriber identity (IMSI)).

The memory 1230 (e.g., a memory 130) may include an internal memory 1232 or an external memory 1234. For example, the internal memory 1232 may include at least one of a volatile memory (e.g., a dynamic random access memory (DRAM), a static RAM (SRAM), or a synchronous DRAM (SDRAM)), a nonvolatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a NAND flash memory, or a NOR flash memory), a hard drive, or a solid state drive (SSD).

The external memory 1234 may include a flash drive, for example, compact flash (CF), secure digital (SD), micro secure digital (Micro-SD), mini secure digital (Mini-SD), extreme digital (xD), multimedia card (MMC), a memory stick, or the like. The external memory 1234 may be functionally and/or physically connected to the electronic device 1200 through various interfaces.

The sensor module 1240 may measure, for example, a physical quantity or may detect an operation state of the electronic device 1200. The sensor module 1240 may convert the measured or detected information to an electric signal. The sensor module 1240 may include at least one of a gesture sensor 1240A, a gyro sensor 1240B, a pressure sensor 1240C, a magnetic sensor 1240D, an acceleration sensor 1240E, a grip sensor 1240F, a proximity sensor 1240G, a color sensor 1240H (e.g., red, green, blue (RGB) sensor), a heart rate sensor 1240I, a temperature/humidity sensor 1240J, an illuminance sensor 1240K, or an UV sensor 1240M. Additionally, the sensor module 1240 may further include, for example, an E-nose sensor, an electromyography sensor (EMG) sensor, an electroencephalogram (EEG) sensor, an electrocardiogram (ECG) sensor, a photoplethysmographic (PPG) sensor, an infrared (IR) sensor, an iris sensor, and/or a fingerprint sensor. The sensor module 1240 may further include a control circuit for controlling at least one or more sensors included therein. The electronic device 1200 may further include a processor which is a part of the AP 1210 or independent of the AP 1210 and is configured to control the sensor module 1240. The processor may control the sensor module 1240 while the AP 1210 remains at a sleep state.

The input device 1250 may include, for example, a touch panel 1252, a (digital) pen sensor 1254, a key 1256, or an ultrasonic input unit 1258. The touch panel 1252 may use at least one of capacitive, resistive, infrared and ultrasonic detecting methods. Also, the touch panel 1252 may further include a control circuit. The touch panel 1252 may further include a tactile layer to provide a tactile reaction to a user.

The (digital) pen sensor 1254 may be, for example, a part of a touch panel or may include an additional sheet for recognition. The key 1256 may include, for example, a physical button, an optical key, a keypad, and the like. The ultrasonic input device 1258 may detect (or sense) an ultrasonic signal, which is generated from an input device, through a microphone 1288 and may check data corresponding to the detected ultrasonic signal.

The display 1260 (e.g., a display 160) may include a panel 1262, a hologram device 1264, or a projector 1266. The panel 1262 may be configured the same as or similar to a display 160 of FIG. 1. The panel 1262 and the touch panel 1252 may be integrated into a single module. The hologram device 1264 may display a stereoscopic image in a space using a light interference phenomenon. The projector 1266 may project light onto a screen to display an image. The screen may be arranged within or external to the electronic device 1200. The display 1260 may further include a control circuit for controlling the panel 1262, the hologram device 1264, or the projector 1266.

The interface 1270 may include, for example, an HDMI (high-definition multimedia interface) 1272, a USB (universal serial bus) 1274, an optical interface 1276, or a D-sub (D-subminiature) 1278. The interface 1270 may be included, for example, in a communication interface 170 illustrated in FIG. 1. Additionally or generally, the interface 1270 may include, for example, a mobile high definition link (MHL) interface, a SD card/multi-media card (MMC) interface, or an infrared data association (IrDA) standard interface.

The audio module 1280 may convert a sound and an electric signal in dual directions. At least a portion of the audio module 1280 may be included, for example, in an input/output interface 150 illustrated in FIG. 1. The audio module 1280 may process, for example, sound information that is input or output through a speaker 1282, a receiver 1284, an earphone 1286, or the microphone 1288.

The camera module 1291 for shooting a still image or a video may include, for example, at least one image sensor (e.g., a front sensor or a rear sensor), a lens, an image signal processor (ISP), or a flash (e.g., an LED or a xenon lamp).

The power management module 1295 may manage, for example, power of the electronic device 1200. According to the present invention, a power management integrated circuit (PMIC) a charger IC, or a battery gauge may be included in the power management module 1295. The PMIC may have a wired charging method and/or a wireless charging method. The wireless charging method may include, for example, a magnetic resonance method, a magnetic induction method or an electromagnetic method and may further include an additional circuit, for example, a coil loop, a resonant circuit, or a rectifier, and the like. The battery gauge may measure, for example, a remaining capacity of the battery 1296 and a voltage, current or temperature thereof while the battery is charged. The battery 1296 may include, for example, a rechargeable battery or a solar battery.

The indicator 1297 may display a specific state of the electronic device 1200 or a portion thereof (e.g., an AP 1210), such as a booting state, a message state, a charging state, and the like. The motor 1298 may convert an electrical signal into a mechanical vibration and may generate the following effects: vibration, haptic, and the like. A processing device (e.g., a GPU) for supporting a mobile TV may be included in the electronic device 1200. The processing device for supporting a mobile TV may process media data according to the standards of DMB, digital video broadcasting (DVB), MediaFlo™, or the like.

Each of the above-mentioned elements of the electronic device according to the present disclosure may be configured with one or more components, and the references of the elements may change according to the type of the electronic device. The electronic device according to the present disclosure may include at least one of the above-mentioned elements, and some elements may be omitted or other additional elements may be added. Furthermore, some of the elements of the electronic device according to the present disclosure may be combined with each other to form a single entity, so that the functions of the elements may be performed in the same manner as before the combination.

The term "module" used herein may represent, for example, a unit including one or more combinations of hardware, software and firmware. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific IC (ASIC) chip, a field-programmable gate array (FPGA), and a programmable-logic device for performing known operations or operations that will be developed.

At least a portion of an apparatus (e.g., modules or functions thereof) or a method (e.g., operations) according to the present disclosure may be, for example, implemented by instructions stored in a computer-readable storage media in the form of a program module. The instruction, when executed by one or more processors (e.g., a processor 120), may cause the one or more processors to perform a function corresponding to the instruction. The computer-readable storage media, for example, may be the memory 130.

A computer-readable recording medium may include a hard disk, a magnetic media, a floppy disk, a magnetic media (e.g., a magnetic tape), an optical media (e.g., a compact disc read only memory (CD-ROM) and a digital versatile disc (DVD), a magneto-optical media (e.g., a floptical disk), and hardware devices (e.g., a read only memory (ROM), a random access memory (RAM), or a flash memory). Also, a program instruction may include not only a mechanical code, e.g., as generated by a compiler, but also a high-level language code executable on a computer using an interpreter. In addition, a hardware unit may operate via one or more software modules to operate the present disclosure.

A module or a program module according to the present disclosure may include at least one of the above elements, or a portion of the above elements may be omitted, or additional other elements may be further included. Operations performed by a module, a program module, or other elements according to various embodiments of the present disclosure may be executed sequentially, in parallel, repeatedly, or in a heuristic method. Also, a portion of operations may be executed in different sequences, omitted, or other operations may be added.

In accordance with an aspect of the present disclosure, an electronic device accommodates a plurality of cards. The electronic device includes a first contact area connected to a first card among the plurality of cards and a second contact area configured to selectively connect to a second card or a third card among the plurality of cards.

According to the above, various cards may be installed in the electronic device using one card connector and the electronic device may recognize the cards through the one card connector, and thus a space utilization efficiency of the electronic device is improved.

While the present disclosure has been shown and described with reference to various embodiments thereof, it will be understood by those skilled in the art that various changes in form and details may be made therein without departing from the spirit and scope of the invention, as defined by the appended claims, and equivalents thereof.

What is claimed is:

1. An electronic device accommodating a plurality of cards, the electronic device comprising:
   a tray in which the plurality of cards are installed;
   a card connector which accommodates the tray, the card connector comprising:
      a first contact area electrically connected to a first card installed in a first card area of the tray;
      a second contact area selectively connected to one of a second card and a third card, which is installed in a second card area of the tray,
   wherein the tray comprises a first groove in a side surface of the tray and a second groove in the side surface of the tray,
   wherein the card connector comprises a support structure coupled to one of the first groove and the second groove, and wherein the support structure is coupled to the first groove if the first card area and the second card area are inserted into the card connector, and the support structure is coupled to the second groove if the second card area is partially discharged from the card connector.

2. The electronic device of claim 1, wherein the second card area comprises:
   a first sub-contact area configured to connect to the second card; and
   a second sub-contact area configured to connect to the third card,
   wherein the first sub-contact area and the second sub-contact area are independently disposed in the second contact area.

3. The electronic device of claim 1, wherein the second contact area comprises a plurality of terminals electrically connected to each of the second card and the third card.

4. The electronic device of claim 3, wherein each of the plurality of terminals comprises:
   a fixing part;
   a supporting part connected to the fixing part, extending from the fixing part in a predetermined direction, wherein the supporting part has an elasticity;
   a bending part connected to the supporting part, wherein the bending part is configured to contact one of the second card and the third card; and
   an extending part extending from the bending part.

5. The electronic device of claim 1, wherein the second contact area is spaced apart from a center portion of the electronic device, with the second contact area positioned further away from the center portion than the first contact area.

6. The electronic device of claim 1, wherein each of the first card and the second card is a subscriber identification card, and the third card is a memory card.

7. The electronic device of claim 1, wherein card connector further comprises:
   a tray recognition part that senses the tray.

8. The electronic device of claim 1, wherein the first contact area and the second contact area are arranged in a same direction in which the tray is inserted or discharged.

9. The electronic device of claim 1, wherein the first contact area and the second contact area are arranged in a direction substantially perpendicular to a direction in which the tray is inserted.

10. The electronic device of claim 1, wherein the card connector further comprises:
    a tray discharge part that discharges the tray.

11. The electronic device of claim 10, wherein the tray discharge part is operated in a push-push button manner.

12. The electronic device of claim 1, wherein the first groove is disposed adjacent to the second card area on the side surface of the tray and the second groove is disposed adjacent to the first card area on the side surface of the tray.

13. The electronic device of claim 1, wherein the first groove is disposed in a side surface area of the second card area.

14. The electronic device of claim 1, wherein the support structure is disposed on a side surface of the second contact area and coupled to one of the first groove and the second groove.

15. The electronic device of claim 1, wherein the tray comprises a stepped structure to prevent the tray from colliding with the first contact area or the second contact area.

16. A tray insertable into an electronic device, the tray comprising:
    a first card area accommodating a first card;
    a second card area having a shape corresponding to each of the first card and a second card, to accommodate at least one of the first card and the second card; and
    a first groove in a side surface of the tray,
    a second groove in the side surface of the tray,
    wherein the first groove and the second groove are disposed in a side surface area of the second card area, and wherein the first groove is coupled to a support structure of the electronic device if the first card area and the second card area are inserted into the electronic device, and the second groove is coupled to the support structure if the second card area is partially discharged from the electronic device.

17. The tray of claim 16, wherein the first card area and the second card area are sequentially arranged in a direction corresponding to a direction in which the tray is inserted, with the first card area being inserted into the electronic device prior to inserting the second card area into the electronic device.

* * * * *